United States Patent [19]

Chapman

[11] Patent Number: 4,827,191
[45] Date of Patent: May 2, 1989

[54] ADAPTIVE RANGE/DC RESTORATION CIRCUIT OR USE WITH ANALOG TO DIGITAL CONVERTORS

[75] Inventor: Ronald H. Chapman, Winfield, Ill.

[73] Assignee: Motorola, Inc., Schaumburg, Ill.

[21] Appl. No.: 93,468

[22] Filed: Sep. 8, 1987

[51] Int. Cl.[4] .............................................. H03M 1/18
[52] U.S. Cl. .................................. 341/132; 341/139; 341/156; 358/174
[58] Field of Search .... 340/347 AD, 347 M, 347 LC, 340/347 R, 347 C; 367/65-67; 358/169-173

[56] References Cited

U.S. PATENT DOCUMENTS

| | | | |
|---|---|---|---|
| 3,295,060 | 12/1966 | Stern | 307/351 X |
| 3,846,710 | 11/1974 | Chapman | 330/11 |
| 3,979,670 | 9/1976 | Vahaviolos | 307/351 X |
| 4,642,694 | 2/1987 | Yamagishi et al. | 358/169 X |
| 4,746,816 | 5/1988 | Olesen | 307/351 |

OTHER PUBLICATIONS

The Engineering Staff of Digital Equipment Corporation, Analog-Digital Conversion Handbook, 1964, pp. 20-22.

Primary Examiner—William M. Shoop, Jr.
Assistant Examiner—Brian Young
Attorney, Agent, or Firm—Steven G. Parmelee

[57] ABSTRACT

An adaptive range circuit (10) suitable for use with an analog to digital convertor (11) having operating range control inputs. The invention includes a peak detection unit (12) that can include a positive peak detector (13) and a negative peak detector (14) that provide signals representative of positive and negative peaks for the incoming analog signal to be digitized. These representative signals can be utilized to control the operating range of the A/D convertor (11).

14 Claims, 4 Drawing Sheets

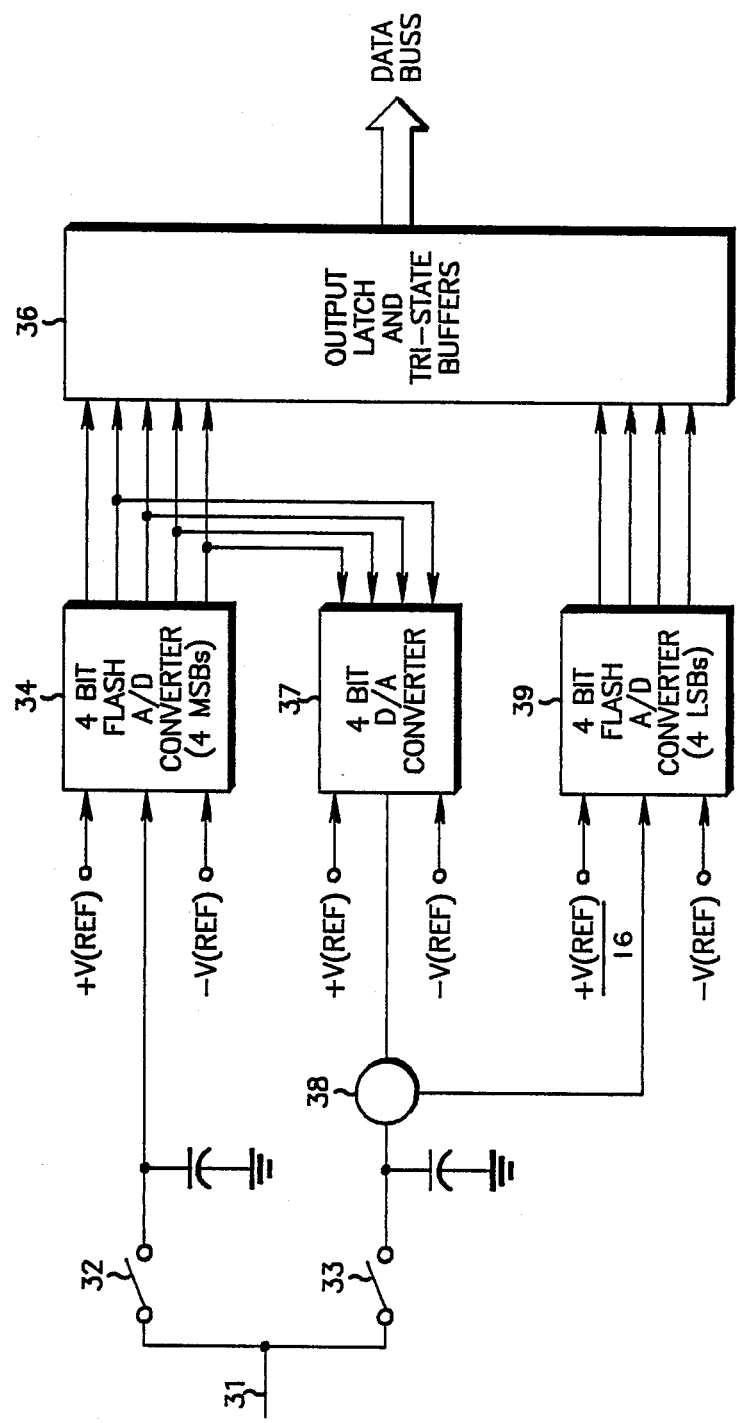

ADAPTIVE RANGE/DC RESTORATION CIRCUIT OR USE WITH ANALOG TO DIGITAL CONVERTORS

TECHNICAL FIELD

This invention relates generally to analog to digital convertors, and particularly to analog to digital convertors having a selectable input voltage range.

BACKGROUND ART

Analog to digital convertors are well known in the art. Such convertors typically operate by dividing an operating input voltage range into a plurality of segments. A resultant binary signal can then be provided that relates to the number of segments that correspond to the magnitude of an actual input analog signal sample.

For optimum resolution of the digitizing process, the input voltage range should have some general correspondence to the general operating range of the incoming analog signal. For example, an analog signal that varies between 0 and 5 volts would not necessarily be well represented in digital form if digitized with respect to an input voltage range of 0-25 volts. Instead, better resolution would generally result if the input voltage range were also 0-5 volts.

To meet this need, many analog to digital convertors have at least one range control input. Such an input allows the user to select the input voltage range. For some prior art convertors, the user may select from two or more preselected ranges by pin selection. In other convertors, maximum and minimum range inputs are provided such that the range can be selected over a relatively wide continuum.

For many applications, the above provisions are not adequate. For example, in digital signal processing, one determines certain signal attributes relative to the signal itself, instead of comparing the signal to some fixed predetermined value. Using prior approaches in this context can lead to reduced resolution and possible errors.

A need therefore exists for a means of ensuring adequate resolution during a digitization process while simultaneously accommodating fluctuations in the incoming signal.

SUMMARY OF THE INVENTION

These needs and others are substantially met through provision of the adaptive range/DC restoration circuit disclosed herein. In one embodiment, the adaptive range circuit includes a peak detection unit that receives the analog signal and provides a resultant signal that is representative of a peak for the analog signal. This resultant signal can then be provided to a range control input of an associated analog to digital convertor. In this way, the input voltage range used by the analog to digital convertor can adaptively respond to envelope variations of the analog signal itself.

In one embodiment of the invention, as used in conjunction with an analog to digital convertor having a maximum peak reference input and a minimum peak range input, the peak detection unit can comprise a peak to peak amplitude detector that receives the analog signal and that provides a first signal to the maximum range input, which first signal is representative of maximum peaks for the analog signal, and a second signal to the minimum range input, which second signal is representative of a minimum peak for the analog signal. So configured, both the lower and upper limits of the input voltage range for the A/D convertor can be varied in response to fluctuations of the analog signal. In yet another embodiment, for use with analog to digital convertors having pin selectable predetermined operating ranges, the adaptive range circuit can comprise a peak detection unit that again provides a signal representative of peaks for the analog signal, which signals can be utilized to control the pin assignments for the analog to digital convertor to allow use of the most appropriate available predetermined input voltage range.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein:

FIG. 3 comprises a block diagram depiction of the A/D convertor shown in the first embodiment;

BEST MODE FOR CARRYING OUT THE INVENTION

Figure 1:
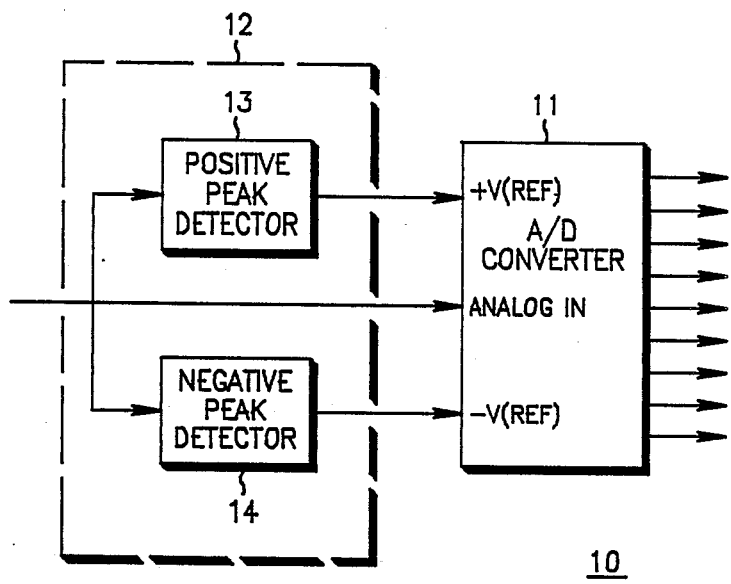
FIG. 1 comprises a block diagram depiction of a first embodiment.

Referring now to the drawings, and in particular to FIG. 1, the adaptive range circuit can be seen as depicted generally by the numeral 10 to operate in conjunction with an analog to digital convertor (11). The adaptive range circuit (10) includes a peak to peak amplitude detector (12) that includes a positive peak detector (13) and a negative peak detector (14). Each peak detector (13 and 14) receives the analog signal to be digitized. The positive peak detector (13) provides a signal representative of the positive peaks of the analog signal to the maximum span input port (+V(REF)) of the A/D convertor (11) and the negative peak detector (14) provides a signal indicative of negative peaks for the analog signal to the minimum span input (−V(REF)). So configured, the input voltage range for the A/D convertor (11) as defined by the maximum and minimum span inputs will vary as a function of the positive and negative peaks of the analog signal itself.

The above generally referred to components will now be described in more detail in seriatim fashion.

Figure 2:
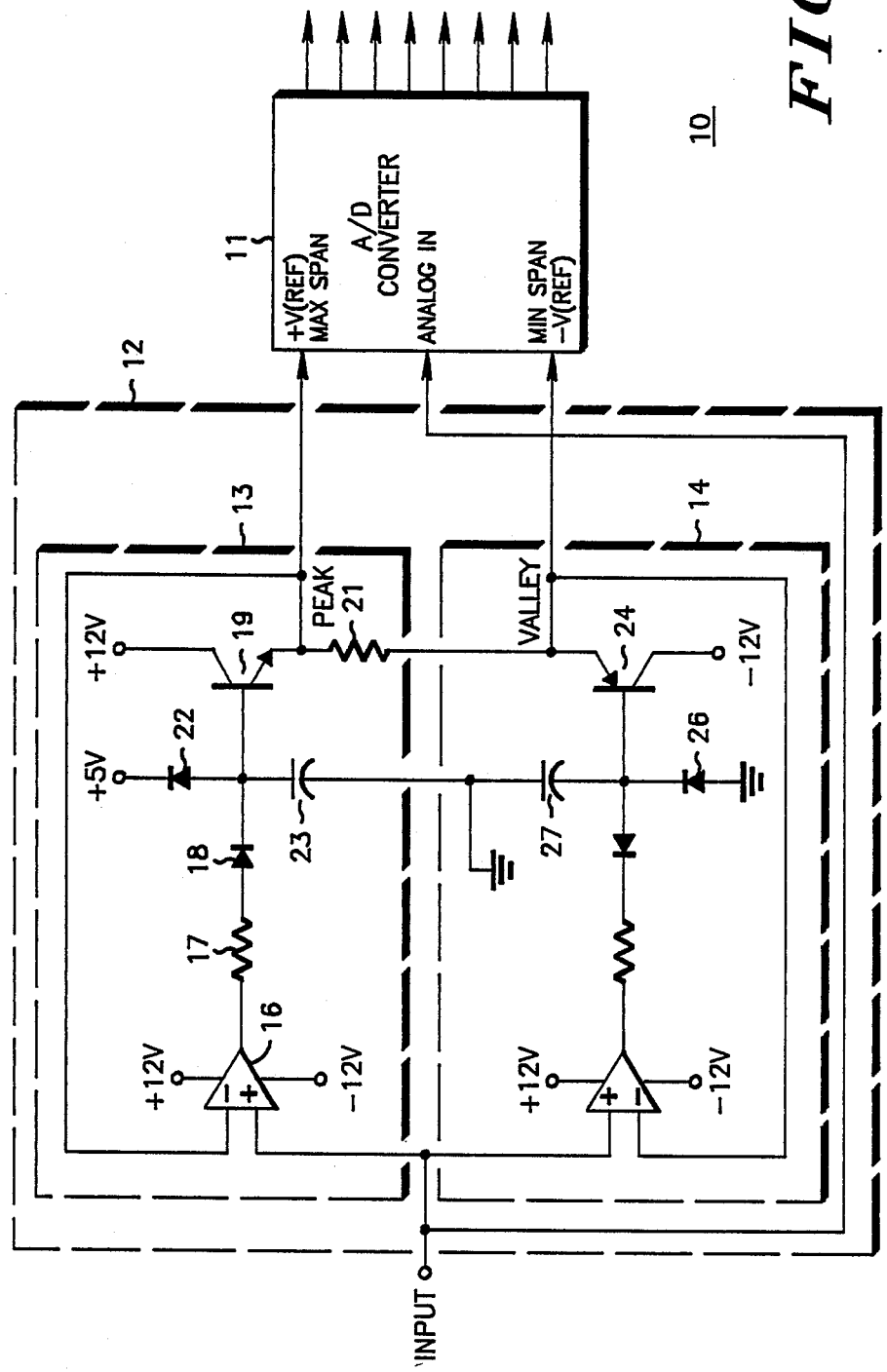
FIG. 2 comprises a schematic diagram of the first embodiment.

Referring now to FIG. 2, the positive peak detector (13) includes a first comparator (16) having its non-inverting input connected to receive the analog signal input, and an inverting input that connects to receive a feedback signal as referred to below. The output of the comparator (16) connects through an appropriate series connected resistor (17) and diode (18) to the base of an NPN transistor (19) that connects between a positive 12 volt source and through a resistor (21) to the emitter of the PNP transistor (24) referred to below. In addition, the base of the transistor (19) connects to a positive 5 volt source through another diode (22) and to a grounded capacitor (23). The emitter of the transistor (19) comprises the output of the positive peak detector, which output is fed back to the inverting input of the comparator (16) and also to the maximum span input of the A/D convertor (11) (which may be, for example, an ADC0820CCN A/D convertor as manufactured by National Semiconductor).

So configured, the positive peak detector (13) will provide signals indicative of the positive peaks to the base of the transistor (19). The capacitor (23) will function to maintain the value of these peaks somewhat over time, such that the output of the positive peak detector (13) will comprise a value representative of and based upon the peaks of the analog input signal, while not necessarily representing a moment by moment representation thereof.

The negative peak detector (14) is constructed similarly to the positive peak detector (13), with the exception that the transistor (24) comprises a PNP transistor and the diode (26) that connects to the base of the transistor (24) connects to ground. The output of the negative peak detector (14) connects to the minimum span input of the A/D convertor (11), to provide a signal representative of the minimum peaks of the analog signal.

With brief reference to FIG. 3, the internal functioning of the A/D convertor (11) can be seen as set forth in block format fashion. The analog input (31) connects, via appropriate sample-and-hold switches (32 and 33), to other components that allow the digitizing process as follows.

Initially, the 4 most significant bits representing the analog signal are determined by sampling the analog signal provided by the first sample-and-hold switch (32) to a 4 bit flash analog to digital convertor (34). This flash ADC utilizes an input voltage range specified as described above by the positive and negative peak detectors (13 and 14). The resulting digitized signals are provided both to an output latch and tri-state buffer structure (36) for subsequent provision to a data bus, and also to a 4 bit digital to analog convertor (37) that reconverts the digitized representation of the 4 most significant bits into an analog signal, which analog signal can be subtracted in an appropriate subtraction unit (38) from the analog signal itself as provided by the second sample-and-hold switch (33).

The 4 bit digital to analog convertor (37) again uses a voltage range as controlled by the positive and negative peak detectors (13 and 14). The resulting differential between the analog signal and the analog signal representative of the four most significant bits is provided to a second 4 bit flash ADC (39) which yields the 4 least significant bits representative of the analog signal. In this case, the maximum range is provided by the positive peak detector (13) as divided by the number 16. The resulting digitized output is provided to the output latch and tri-state buffers (36), where they are combined to yield ultimately an 8 bit representation of the original analog signal Configured as described above, the operating range of the A/D convertor (11) can vary over time to accommodate fluctuations in the analog signal itself.

Figure 4:
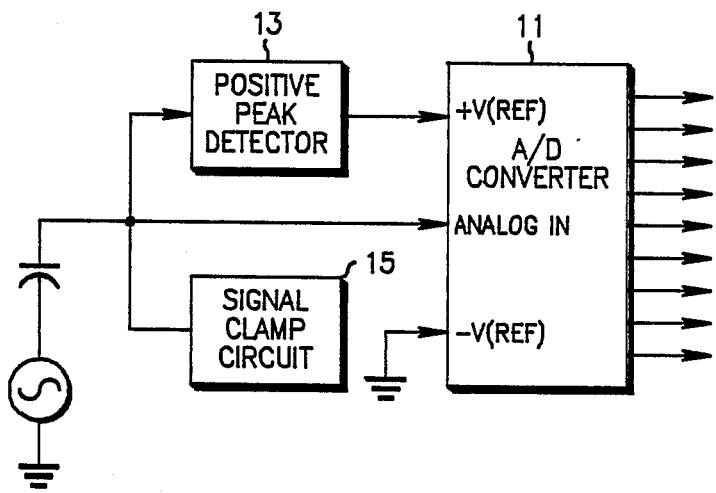
FIG. 4 comprises a block diagram depiction of a second embodiment.

With reference to FIG. 4, a modified embodiment can be seen. In this embodiment, the low side of the input voltage range ($-V(REF)$) has been fixed at ground. To allow this without a concurrent reduction in resolution, a signal clamp circuit (15) can be used to reference the negative peak of the signal at ground. The positive peaks of the incoming signal are detected by a positive peak detector (13) and determine the upper limit of the input voltage range. This embodiment is appropriate for use with analog signals that do not fall less than zero. Such an embodiment is of course appropriate for use with analog to digital convertors that do not allow an unfixed lower reference value. Also, as various applications may require, this embodiment could of course be altered to provide other fixed references as the input to one or the other of the range control inputs, as appropriate to a given application.

Figure 5:
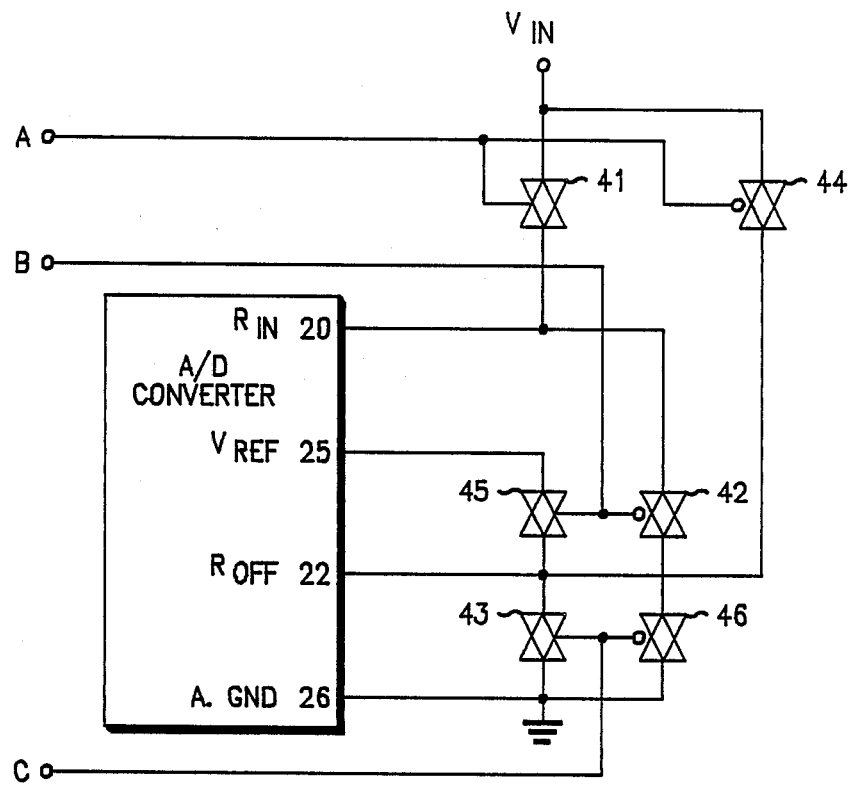
FIG. 5 comprises a portion of a third embodiment.

With reference to FIG. 5, another embodiment can be seen as functions in conjunction with an A/D convertor such as the MC6108 as manufactured by Motorola, Inc. Such an A/D convertor does not have an operating range that can be varied over a continuum. Instead, the operator may select any of three operating ranges (0-10 volts, 0-5 volts, and $-5$ to $+5$ volts). These ranges are selected by appropriate interconnections between four pins $R_{IN}$ (pin 20), $V_{REF}$ (pin 25), $R_{OFF}$ (pin 22), and A.GND (pin 26).

The circuitry depicted in FIG. 5 provides appropriate control gates to control the connection of these pins between themselves and the analog signal input. For instance, to provide the zero to 10 volt range, three of the gates (41, 42, and 43) are switched on, and the remaining three gates (44, 45, and 46) are switched off. So configured, the analog signal ($V_{IN}$) will be connected to $R_{IN}$ (pin 20), and $R_{OFF}$ (pin 22) will be connected to A.GND (pin 26). To obtain the zero to 5 volt range, three of the logic gates are again switched on (44, 42, and 46) and the remaining three are switched off (41, 45, and 43). So configured, the analog signal will be connected to $R_{OFF}$ and $R_{IN}$ will be connected to A.GND. Finally, to achieve $-5$ to $+5$ volt range, a different three logic gates are switched on (41, 45, and 46) and the remaining three are switched off (44, 42, and 43). So configured, the analog signal will be provided to $R_{IN}$ and $V_{REF}$ will be connected to $R_{OFF}$.

Figure 6:
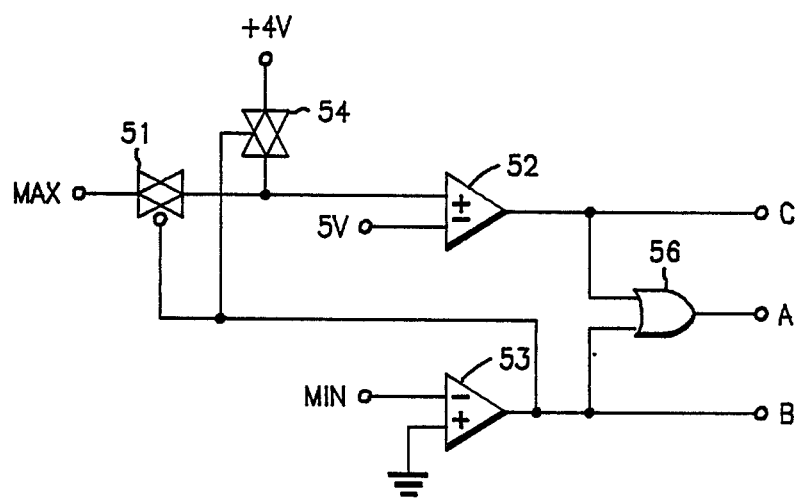
FIG. 6 comprises a schematic diagram of another portion of the third embodiment.

Referring now to FIG. 6, circuitry can be seen that provides the appropriate gate control signals to the logic gates depicted in FIG. 5. Positive peak signals from the positive peak detector (13) can be provided through a first logic gate (51) to the non-inverting input of a first comparator (52). The inverting input of this comparator (52) can connect to an appropriate reference voltage, such as 5 volts. In a similar manner, the minimum peak detector output can connect to the inverting input of the second comparator (53), which, in this embodiment, has its non-inverting input connected to ground. Two additional logic gates (54 and 56) are provided and configured as depicted to allow the following operation.

When the analog signal operates within a range of between 0-5 volts, as indicated by the outputs of the positive and negative peak detectors, both comparators (52 and 53) will provide low outputs, with the result being that gate control signals A, B, and C will all be low. Referring again to FIG. 5, provision of low signals as described will cause the indicated gates (41-46) to cause the A/D convertor to select the 0-5 volt operating range.

Referring again to FIG. 6, if the analog signal begins to operate in an operating range of 0-10 volts, the first comparator (52) will provide a high output, while the second comparator (53) continues to provide a low output. So biased, the A and C signals will be high and the B signal will be low. This combination of signals will cause the associated A/D convertor to select the 0-10 volt range. In a similar manner, the circuitry depicted in FIG. 6 will cause the −5 to +5 volt range to be selected when the minimum peak drops below zero.

So configured, the embodiment described will allow preselected operating ranges of the A/D convertor to be selected based upon the operating envelope of the analog signal.

Those skilled in the art will recognize that such an adaptive operating range control circuit will not be suitable for all applications. For many normal analog to digital conversion applications, allowing the operating range to change would yield non-useful digitized data. There are certain applications, however, where such adaptive techniques are highly advantageous. For example, in some two-way radio communication systems, it becomes necessary to receive a digital signal The digital signal itself must of course be decoded in order to identify the "ones" and "zeroes" When the incoming digital signal has a varying DC component, however, appropriate measures must be taken to vary the comparative threshold that is ordinarily utilized to distinguish a one from a zero to ensure that a varying envelope for the digital signal does not impair the integrity of the process. If such a digital signal is used as the analog signal in the above described embodiments, then the digital signal can itself be digitized to yield an output digital signal that can be compared against a reference to ascertain the presence of a one or a zero. And, by using the adaptive range circuits described above, DC fluctuations can be taken into account to assure the veracity of this technique.

Those skilled in the art will recognize that various modifications and changes could be made with respect to the above described embodiments without departing from the spirit and scope of the invention. It should therefore be understood that such limitations are not to be considered a part of the claims unless specific limitations directed to such embodiments are specifically set forth.

I claim:

1. An adaptive range circuit for use with an analog-to-digital converter having an analog signal input and at least one range control input, said adaptive range circuit comprising:
   (A) analog peak detection means for receiving said analog signal, for providing a first signal representative of a peak for said analog signal, and for providing a second signal based upon said first signal to said at least one range control input to control said range.

2. The adaptive range circuit of claim 1 wherein said analog to digital convertor includes a plurality of range control inputs, and said peak detection means provides a signal to at least some of said inputs to control said range.

3. The adaptive range circuit of claim 2 wherein at least one of said range control inputs comprises a maximum range input.

4. The adaptive range circuit of claim 3 wherein in at least another of said range control inputs comprises a minimum range input.

5. The adaptive range circuit of claim 3 wherein said first signal representative of a peak comprises a signal representative of a maximum peak for said analog signal that is provided to said maximum range input.

6. An adaptive range circuit for use with an analog-to-digital converter having a maximum range input, a minimum range input, and an analog signal input, the adaptive range circuit comprising:
   (A) analog means for receiving said analog signal and for providing a signal representative of a peak for said analog signal to one of said maximum range and minimum range inputs.

7. The adaptive range circuit of claim 6 wherein said signal representative of a peak is provided to said maximum range input.

8. The adaptive range circuit of claim 6 and further including:
   (B) reference signal means for providing a substantially constant reference signal to whichever of said maximum signal and minimum signal inputs does not receive said signal representative of a peak.

9. The adaptive range circuit of claim 8 wherein said signal representative of a peak is provided to said maximum range input and said substantially constant reference signal is provided to said minimum range input.

10. The adaptive range circuit of claim 6 wherein said signal representative of a peak comprises a first signal representative of a maximum peak for said analog signal.

11. The adaptive range circuit of claim 10 wherein said first signal is provided to said maximum range input.

12. The adaptive range circuit of claim 11 wherein said peak detection means also provides a second signal representative of a minimum peak for said analog signal.

13. The adaptive range circuit of claim 12 wherein said second signal is provided to said minimum range input.

14. A D.C. restoration circuit for use with an analog-to-digital converter having a maximum range input, a minimum range input, and an analog signal input, the D.C. restoration circuit comprising:
   (A) analog peak-to peak amplitude detector means for receiving said analog signal and for providing:
   (i) a first signal to said maximum range input representative of a maximum peak for said analog signal; and
   (ii) a second signal to said minimum range input representative of a minimum peak for said analog signal.

* * * * *

UNITED STATES PATENT AND TRADEMARK OFFICE
CERTIFICATE OF CORRECTION

PATENT NO. : 4,827,191

DATED : May 2, 1989

INVENTOR(S) : Ronald H. Chapman

It is certified that error appears in the above-identified patent and that said Letters Patent is hereby corrected as shown below:

Col. 6, line 15, between the words "analog" and "means" please insert --peak detection--.

On the title page, item [54] and in column 1, line 3, in the title:

Between the words "CIRCUIT" and "USE", the word "OR" should be --FOR--.

Signed and Sealed this

Twentieth Day of February, 1990

*Attest:*

JEFFREY M. SAMUELS

*Attesting Officer*     *Acting Commissioner of Patents and Trademarks*